United States Patent
Sazawa et al.

(10) Patent No.: US 7,750,351 B2
(45) Date of Patent: Jul. 6, 2010

(54) EPITAXIAL SUBSTRATE FOR FIELD EFFECT TRANSISTOR

(75) Inventors: Hiroyuki Sazawa, Tsukuba (JP); Koji Hirata, Haruhi (JP); Masayoshi Kosaki, Haruhi (JP); Hajime Okumura, Tsukuba (JP)

(73) Assignees: Sumitomo Chemical Company, Limited, Tokyo (JP); Toyoda Gosei Co., Ltd., Nishikasugai-Gun (JP); National Institute of Advanced Industrial Science and Technology, Tokyo (JP)

( * ) Notice: Subject to any disclaimer, the term of this patent is extended or adjusted under 35 U.S.C. 154(b) by 870 days.

(21) Appl. No.: 11/386,844

(22) Filed: Mar. 23, 2006

(65) Prior Publication Data

US 2007/0069253 A1    Mar. 29, 2007

(30) Foreign Application Priority Data

Sep. 28, 2005    (JP)    ............................. 2005-281344

(51) Int. Cl.
*H01L 23/29*    (2006.01)
*H01L 21/04*    (2006.01)

(52) U.S. Cl. .............. 257/77; 257/1; 257/213; 257/E23.122; 257/E21.054; 438/931

(58) Field of Classification Search .............. 257/1, 257/77, 213, E23.122, E21.054; 438/931
See application file for complete search history.

(56) References Cited

U.S. PATENT DOCUMENTS

| | | | |
|---|---|---|---|
| 6,376,900 B1 * | 4/2002 | Yamada et al. | 257/629 |
| 6,734,461 B1 * | 5/2004 | Shiomi et al. | 257/77 |
| 7,186,620 B2 * | 3/2007 | Otsuka et al. | 438/285 |
| 2002/0158251 A1 * | 10/2002 | Takahashi et al. | 257/70 |

* cited by examiner

*Primary Examiner*—Victor A Mandala
(74) *Attorney, Agent, or Firm*—Birch, Stewart, Kolasch & Birch, LLP

(57) ABSTRACT

An epitaxial crystal for a field effect transistor which has a nitride-based III-V group semiconductor epitaxial crystal grown on a SiC single crystal base substrate having micropipes by use of an epitaxial growth method, wherein at least a part of the micropipes spreading from the SiC single crystal base substrate into the epitaxial crystal terminate between an active layer of the transistor and the SiC single crystal base substrate.

8 Claims, 3 Drawing Sheets

EPITAXIAL SUBSTRATE FOR FIELD EFFECT TRANSISTOR

BACKGROUND OF THE INVENTION (1) Field of the Invention

The present invention relates to a nitride-based III-V group semiconductor epitaxial crystal for a field effect transistor.

(2) Description of the Related Art

A field effect transistor using a nitride-based III-V group semiconductor epitaxial substrate (hereinafter referred to as a GaN-FET) is a field effect transistor driven by using a GaN layer as a channel layer, and is a device which has been rapidly attracting attention in recent years for its use in high-frequency and power device applications, because this transistor has a high breakdown voltage and a higher heat-resisting property, and also each component of this transistor has a lower impact on environment, in comparison with the conventional FET having a channel made of an epitaxial semiconductor crystal such as GaAs, AlGaAs, InGaAs, InGaP, and AlInGaP, for example.

The GaN-FET is fabricated by stacking an epitaxial crystal on a base substrate in accordance with the electron beam epitaxial growth, the metalorganic vapor phase epitaxy (hereinafter referred to as the MOVPE method) and the like, and then processing the laminate into a desired device shape with the use of photolithography. Among these GaN-FETs, a transistor having an active layer made of a two-dimensional electron gas (hereinafter referred to as a 2DEG) induced at an interface between an AlGaN layer and a GaN layer is known as a GaN-HEMT, and is strongly expected to be put to practical use because of its excellent high-frequency characteristic.

As the base substrate beneath the epitaxial crystal used for such a GaN-HEMT, a substrate having a relatively small lattice mismatch with the nitride-based III-V group semiconductor crystal such as single crystal sapphire, single crystal silicon carbide (hereinafter referred to use as SiC) and single crystal silicon is used when the MOVPE method is employed for example. Among others, SiC has favorable characteristics as a substrate used for a power device with a high heating value, since SiC exhibits a good heat radiation characteristic during the operation of the device because of its large thermal conductivity in addition to its small lattice mismatch.

However, the commercially available SiC substrate is known to have a vacancy(ies) referred to as a micropipe(s) which penetrates through the substrate and has a diameter of several hundreds nanometers to several micrometers at a density of 0 to 50/cm$^2$. Once the nitride-based III-V group semiconductor crystal has been epitaxially grown on the micropipes, they spread into the epitaxial crystal. Thus, there has existed a problem that the GaN-FET formed by using such a crystal has significantly impaired element characteristics such as lead to a short-circuit, an increase in gate leak current and degradation in pinch-off characteristic.

SUMMARY OF THE INVENTION

An object of the present invention is, in view of the above described circumstances, to provide a nitride-based III-V group semiconductor epitaxial crystal having a favorable characteristic even when a great number of micropipes exist in a SiC single crystal base substrate, and to provide a method for manufacturing the same.

The present inventors have completed the present invention based on the findings that a micropipe spreading from a SiC single crystal base substrate through an epitaxial crystal can be made terminate in a crystal portion which exists before reaching an active layer by selecting conditions for growing the epitaxial crystal, and that an epitaxial crystal for a transistor in which the micropipes are made terminate as described above can obtain the same characteristics as in the case of a transistor using an epitaxial crystal in which micropipes do not exist in a SiC single crystal substrate.

That is, the present invention relates to (1) an epitaxial crystal for a field effect transistor which has a nitride-based III-V group semiconductor epitaxial crystal grown on a SiC single crystal base substrate having micropipes by use of an epitaxial growth method, wherein at least a part of the micropipes spreading from the above described SiC single crystal base substrate into the epitaxial crystal terminate between an active layer of the transistor and the above described SiC single crystal base substrate.

Further, the present invention relates to (2) the epitaxial crystal according to the above described (1), wherein 90% or more of the micropipes within the SiC base substrate terminate between an active layer of the transistor and the above described SiC single crystal base substrate.

Further, the present invention relates to (3) the epitaxial crystal according to the above described (2), wherein the micropipes exist within the above described SiC single crystal base substrate at a density of 10 micropipes/cm$^2$ or more.

In addition, the present invention relates to (4) the epitaxial crystal according to any one of the above described (1) to (3), wherein the above described epitaxial growth method is an organo-metallic vapor phase epitaxial method, and wherein a region between a buffer layer at least a part of which is composed of a polycrystal and an active layer composed of a single crystal has a nitride-based III-V group semiconductor epitaxial growth layer containing Ga, which has been grown to a thickness of at least 1 μm or more at a temperature of 1050° C. to 1250° C. and at a pressure of 5 torr to 780 torr.

In addition, the present invention relates to (5) a field effect transistor comprising the epitaxial crystal according to any one of the above described (1) to (4).

In addition, the present invention relates to (6) a method for manufacturing the epitaxial crystal according to any one of the above described (1) to (3), comprising growing a nitride-based III-V group semiconductor epitaxial crystal on a SiC single crystal base substrate having micropipes by the use of an epitaxial growth method, wherein at least one epitaxial crystal layer between the above described SiC single crystal base substrate and the active layer of the transistor is grown at a temperature of 1050° C. to 1250° C. and at a pressure of 5 torr to 780 torr.

Further, the present invention relates to (7) the method according to the above described (6), wherein the above described epitaxial growth method is an organometallic vapor phase epitaxial method, and wherein a nitride-based III-V group semiconductor epitaxial growth layer containing Ga and having a thickness of 1 μm or more is grown at a temperature of 1050° C. to 1250° C. and at a pressure of 5 torr to 780 torr between a buffer layer at least a part of which is composed of a polycrystal and an active layer composed of a single crystal.

The present invention allows micropipes existing in the SiC single crystal base substrate to be closed, and provides a nitride-based epitaxial growth semiconductor crystal for a field effect transistor having good characteristics, and therefore, has an extreme significance in the industrial use.

BRIEF DESCRIPTION OF THE INVENTION

DETAILED DESCRIPTION OF THE INVENTION

Figure 1:
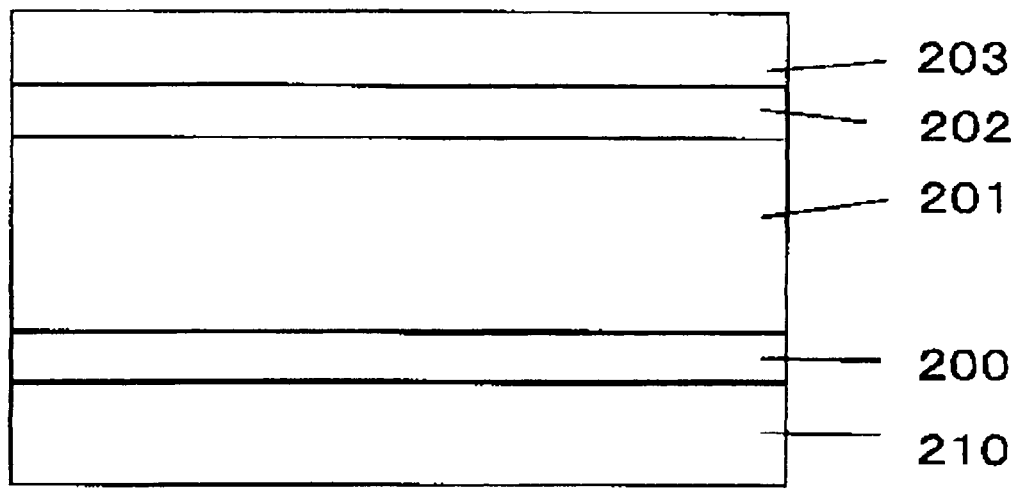
FIG. 1 is a schematic diagram showing an example of a structure of an epitaxially grown crystal for a GaN-HEMT.

An epitaxial crystal for a field effect transistor of the present invention is an epitaxial crystal for a field effect transistor which has a nitride-based III-V group semiconductor epitaxial crystal grown on a SiC single crystal base substrate having micropipes by the use of an epitaxial growth method, characterized in that the micropipe spreading from the above described SiC single crystal base substrate into the epitaxial crystal terminates between an active layer of the transistor and the above described SiC single crystal base substrate.

In this case, a region in which the micropipe terminates between the active layer of the transistor and the base substrate is required to be in a region between a SiC single crystal base substrate having micropipes and the active layer. Particularly, at least a part of, preferably 50% or more of, more preferably 90% or more of the micropipe is required to terminate at least one epitaxial crystal layer between the base substrate and the active layer of the transistor.

Such layer, in which the micropipe terminate, will now be referred to as a micropipe closing layer.

A distance between the above described micropipe closing layer and the active layer is preferably 2000 Å or more, and more preferably 5000 Å or more.

The present invention will now be described in detail by means of an example of fabricating a GaN-FET which has a nitride-based III-V group semiconductor epitaxial crystal for a transistor grown by the use of an MOVPE method.

As III group source materials used for the crystal growth, alkyl gallium such as trimethyl gallium (hereinafter referred to as TMG) or triethyl gallium and alkyl aluminum such as trimethyl aluminum (hereinafter referred to as TMA) or triethyl aluminum are used respectively alone or by mixture so as to yield a desired composition. These source materials, which are commercially available for the MOVPE, can be used.

It is preferable that ammonia is used as a nitrogen source material. Ammonia, which is commercially available and has a high purity required for the crystal growth, can be used.

In addition, it is preferable that disilane or monosilane is used as a silicon source material. Disilane or monosilane, which is commercially available and has a high purity required for the crystal growth, can be used.

As a carrier gas, it is preferable that hydrogen gas and nitrogen gas are used respectively alone or by mixture. The hydrogen gas and the nitrogen gas, which are commercially available and has a high purity for the crystal growth, can be used.

As a base substrate, a SiC substrate is used. Although the above described substrate is preferably semi-insulative, it can be said that a conductive substrate is allowed to be used. Substrates having various sizes are commercially available, but there is no limitation on the size. Substrates having various off-angles and off-directions are commercially available, and these can be used without limitation. It is preferable that a C plane is used as a plane direction of the above described substrate. These substrates, which are commercially available, can be used. According to the present invention, even a less expensive substrate in which micropipes exist at a density of 10 micropipes/cm$^2$ or more can be used, because it is possible to manufacture a crystal for a transistor which has an excellent characteristic even if micropipes exist in the source material substrate.

FIG. 1 is a schematic diagram of an example showing a structure of an epitaxially grown crystal for a GaN-FET according to the present invention. This structure can be obtained as described below.

Firstly, an AlN buffer layer 200 is grown to a predetermined thickness on a SiC single crystal base substrate (a semi-insulative SiC substrate) 210 which has been previously washed, and subsequently a substrate temperature and a reactor pressure are changed to predetermined values before growing a GaN micropipe closing layer 201 to a predetermined thickness by changing a III group source material gas. Then, the substrate temperature and the reactor pressure are changed to predetermined values to grow a GaN channel layer 202 to a predetermined thickness. Then the source material gas, the growing pressure and the growing temperature are changed in order to grow an undoped-AlGaN layer 203 to a predetermined thickness. The structure of FIG. 1 can be obtained as described above.

Although the thickness of the AlN buffer layer 200 is generally 50 Å to 3000 Å, it is preferably 100 Å to 2500 Å and more preferably 200 Å to 2000 Å in view of a balance between productivity and effect.

A reactor pressure during the growth of the GaN micropipe closing layer 201 in which micropipes terminate is within a range from 5 to 780 torr, preferably within a range from 10 to 400 torr, and more preferably within a range from 15 to 200 torr. The substrate temperature in this case is within a range from 1050 to 1250° C., preferably within a range 1100 to 1225° C., and more preferably within a range from 1150 to 1200° C.

The thickness of the GaN micropipe closing layer, the reactor pressure and the substrate temperature are determined taking into consideration productivity, the size of the micropipe to be closed and crystallinity. That is, a higher temperature and a lower reactor pressure result in a micropipe which is easily closed, so that a larger micropipe can be closed by a smaller film thickness. When the substrate temperature is too high, the crystallinity deteriorates, and when the reactor pressure is too low, the source material efficiency deteriorates and the productivity is reduced. Considering all these factors together, the thickness is preferably selected from a range of 1.0 µm or more, more preferably 1.5 µm or more and most preferably 2.0 µm or more. Although there is no upper limitations, a thickness of 5 µm or less is preferable from the view point of productivity.

Instead of the GaN micropipe closing layer, it is also possible to use an AlGaN micropipe closing layer having the same thickness as the GaN micropipe closing layer. In this case, since a difference in a lattice constant between the GaN active layer and the AlGaN micropipe closing layer becomes a problem, a proportion of Al is selected from a range from 0% to 5%. The AlGaN micropipe closing layer can be grown at the same growing pressure and the same growing temperature as in the case of the GaN micropipe closing layer.

The thickness of the GaN channel layer 202 should be increased, because the active layer is influenced by a strain which is put on the closed micropipe within the micropipe closing layer 201 if the thickness of the GaN channel layer 202 is small. A range of such thickness is 2000 Å or more, more preferably 5000 Å or more, and most preferably 10000 Å or more. Although there is no particular upper limitation, the thickness is industrially 20000 Å or less. The reactor pressure is selected within a range from 5 torr to 780 torr. The substrate temperature can be selected within a range from 950° C. to 1300° C.

The thickness of the undoped-AlGaN layer 203 can be set such that the desired pinch-off voltage depth and gm characteristic are provided. However, a larger thickness of the layer leads to a detrimental effect that there is a more significant impact on a lattice mismatch with the undoped-GaN channel layer 202 and then the crystal degrades, and that a smaller thickness of the layer leads to deterioration of the withstanding pressure. Consequently, the thickness is preferably 50 Å to 800 Å, more preferably 100 Å to 600 Å, and much more preferably 200 Å to 400 Å.

In addition, the undoped-AlGaN layer 203 has an n-type conductivity even when the it is undoped, so that electrons within this layer are supplied to a channel to form a 2DEG. Therefore, an n-AlGaN layer grown by being doped with silicon and the like, instead of the undoped-AlGaN layer 203, can also be used for the purpose of controlling the electron concentration of the channel.

In addition, a laminate structure having undoped-AlGaN/n-AlGaN can also be used in order to avoid a possibility that a 2DEG mobility may be reduced due to the impurity scattering when the n-AlGaN layer is used. In this case, the total thickness of the undoped-AlGaN layer and the n-AlGaN layer may be set so as to be the above described thickness.

A composition ratio of Al contained in the undoped-AlGaN layer 203 is determined from the desired 2DEG concentration, gate withstanding pressure, thickness of the AlGaN layer and the like. That is, when the Al composition ratio becomes larger, the transistor can be operated by a high-current because much more 2DEG is theoretically generated and also the gate withstanding pressure is improved. On the other hand, a lattice constant difference with the GaN layer becomes larger, so that a crystal defect is easily developed when the layer thickness is especially large, which may conversely lead to deterioration of the gate withstanding pressure. Thus, the Al composition ratio is preferably set within a range form 10% to 40%, more preferably from 15% to 35%, and much more preferably from 20% to 30%.

The reactor pressure during the growth of undoped-AlGaN layer is preferably selected within a range form 5 torr to 760 torr. The substrate temperature can be selected within a range from 950° C. to 1300° C.

Although an example of the GaN-HEMT has been described herein, it is possible to fabricate an epitaxial substrate for other FET structures such as a MODFET, a MESFET, and a MISFET, by modifying an upper structure above the undoped-GaN high-purity epitaxial crystal layer (a GaN channel layer) 202.

Embodiments of the present invention have been described in the above section, however, such embodiments of the present invention disclosed above are merely illustrations, and the scope of the present invention is not limited to these embodiments. The scope of the present invention is defined by the claims, and is further intended to cover meanings equivalent to the claims and any modifications within the scope of the claims.

Although the present invention will now be described in more detail with reference to the Examples, the present invention should not be limited by these Examples.

Example 1

Using an MOCVD apparatus, a SiC substrate having a density of about 30 micropipes/cm$^2$ was heated to 600° C. for growing an AlN buffer layer to a thickness of 2000 Å.

Then the temperature of the substrate was changed to (1) 950° C., (2) 1050° C. and (3) 1150° C. for stacking an GaN micropipe closing layer to a thickness of 2 μm.

Then, after the substrate temperature was allowed to fall to about a room temperature, the substrate was removed from the reactor. The substrates which had been subjected to (1), (2) and (3) were observed by using a cross-Nicol image generated by transmitted light from an optical microscope in order to identify a position of a micropipe within the substrates, and subsequently, the light was changed to epi-illumination in order to determine whether the above described micropipes were spread to the surface of the micropipe closing layer or was closed in the micropipe closing layer.

The closing rate was determined by the following equation:

(a closing rate)=(the number of micropipe which are not spread to the surface of the micropipe closing layer)/(the number of micropipes within the substrate)×100.

The results were: (1) 0%, (2) about 25%, and (3) about 90%.

Example 2

Using an MOCVD apparatus, a SiC substrate having a density of about 30 micropipes/cm$^2$ was heated to 600° C. for growing an AlN buffer layer to a thickness of 2000 Å.

Then a temperature of the substrate was changed to 1150° C. for stacking a GaN micropipe closing layer to at thickness of 2 μm. And then the temperature of the substrate was changed to 1050° C. for growing an undoped-GaN channel layer to a thickness of 5000 Å.

Subsequently, undoped-AlGaN whose Al composition ratio was 0.25 was grown to a thickness of 250 Å. Then, after the substrate temperature was allowed to fall to about room temperature, the substrate was removed from the reactor.

After confirming that the micropipe within the substrate was closed with respect to the obtained sample, a resist pattern was formed so as to be in alignment such that a gate was located immediately on the closed micropipe by the use of photolithography. Subsequently, N$^+$ ion implantation was performed to provide a device isolation 304 to a depth of 3000 Å. The dose amount of N$^+$ ions was 2E14/cm$^2$.

Then, resist openings were formed so as to correspond to shapes of a source electrode and of a drain electrode by the use of photolithography as described above, and a Ti/Al/Ni/Au metal film was stacked to a thickness of 200 Å/1500 Å/250 Å/500 Å by the use of an evaporation method.

Subsequently, the sample was immersed in acetone to lift-off the resist and the metal film, and then was subjected to an RTA treatment at 800° C. for 30 seconds within a nitrogen atmosphere, in order to form a source electrode 301 and a drain electrode 302. Then an opening was formed so as to correspond to the shape of the gate electrode by the photolithography as described above, and the opening portion was subjected to an ashing treatment with oxygen plasma. The ashing conditions were as follows: an oxygen pressure, 130 Pa; a plasma power, 100 W; and an ashing time, one minute.

Then a Ni/Au metal film was formed to a thickness of 200 Å/1000 Å by the evaporation method, and was lifted-off by the same manner as in the case of the source electrode in order to form a gate electrode 302. A pad electrode was formed by the same manner as in the case of the gate electrode. Consequently, an FET having a gate length of 2 μm and a gate width of 30 μm was fabricated.

Figure 2:
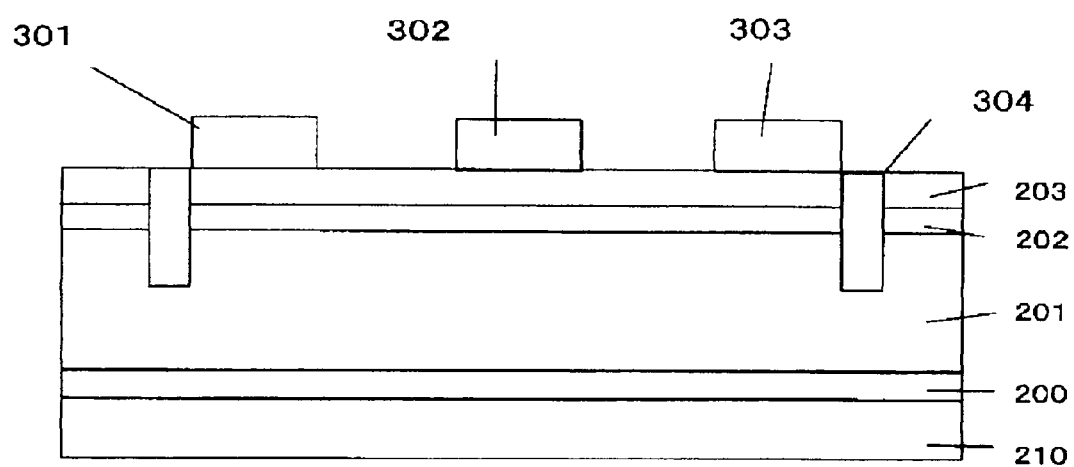
FIG. 2 is a schematic diagram showing a section of a GaN-HEMT obtained in Example 2.
Figure 3:
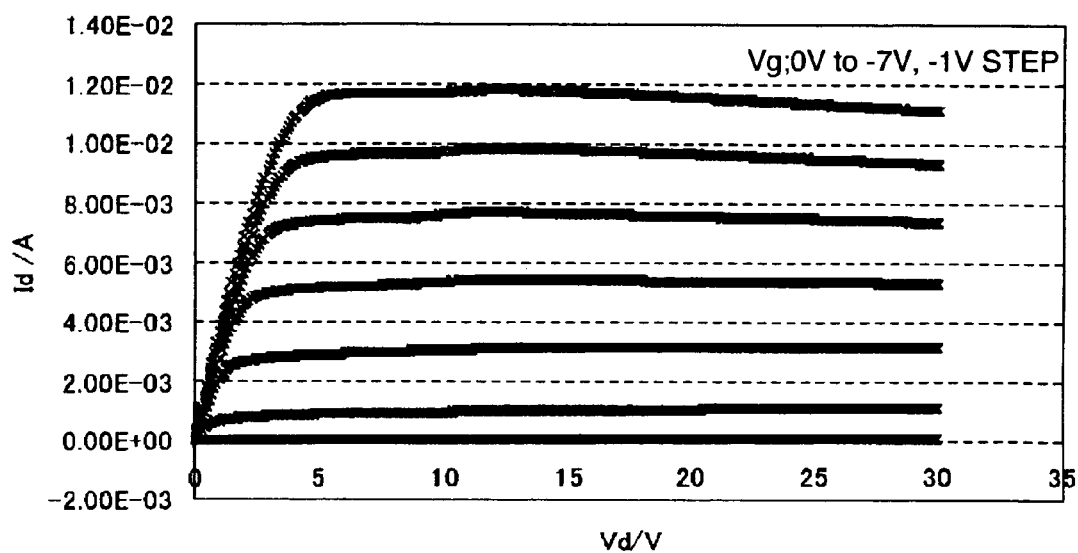
FIG. 3 is a graph showing a current/voltage characteristic at the time of applying a DC voltage to the GaN-HEMT obtained in Example 2.

FIG. 2 is a schematic diagram of a section of the GaN-HEMT fabricated as described above. Next, a current/voltage characteristic at the time of applying a DC voltage to this sample was measured, and the result is shown in FIG. 3.

Comparative Example 1

Using an MOCVD apparatus, a SiC substrate having a density of about 30 micropipes/cm$^2$ was formed and an AlN buffer layer was grown to a thickness of 2000 Å by the same manner as in Example 2. Then the temperature of the substrate was changed to 950° C. for stacking a GaN micropipe closing layer to at thickness of 2 μm.

Subsequently, an undoped-GaN channel layer was grown to a thickness of 5000 Å by the same manner as in Example 1. Then, undoped-AlGaN whose Al composition ratio was 0.25 was grown to a thickness of 250 Å under the same conditions as in Example 1. The temperature of the undoped-GaN channel layer and then the temperature of the substrate were allowed to fall to about room temperature and subsequently the substrate was removed from the reactor.

Figure 4:
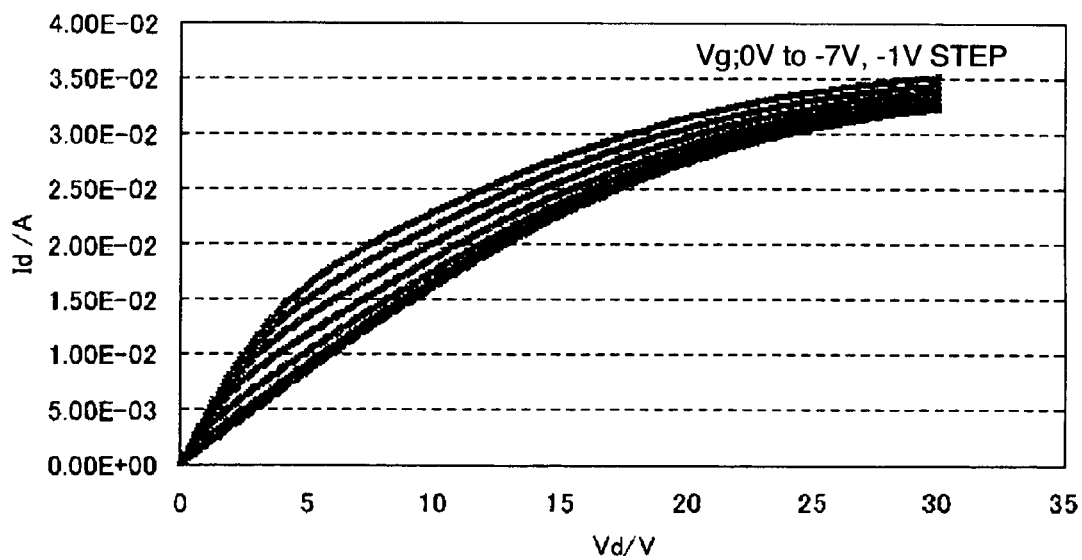
FIG. 4 is a graph showing a current/voltage characteristic at the time of applying a DC voltage to a GaN-HEMT on an open micropipe obtained in Comparative Example 2.
Figure 5:
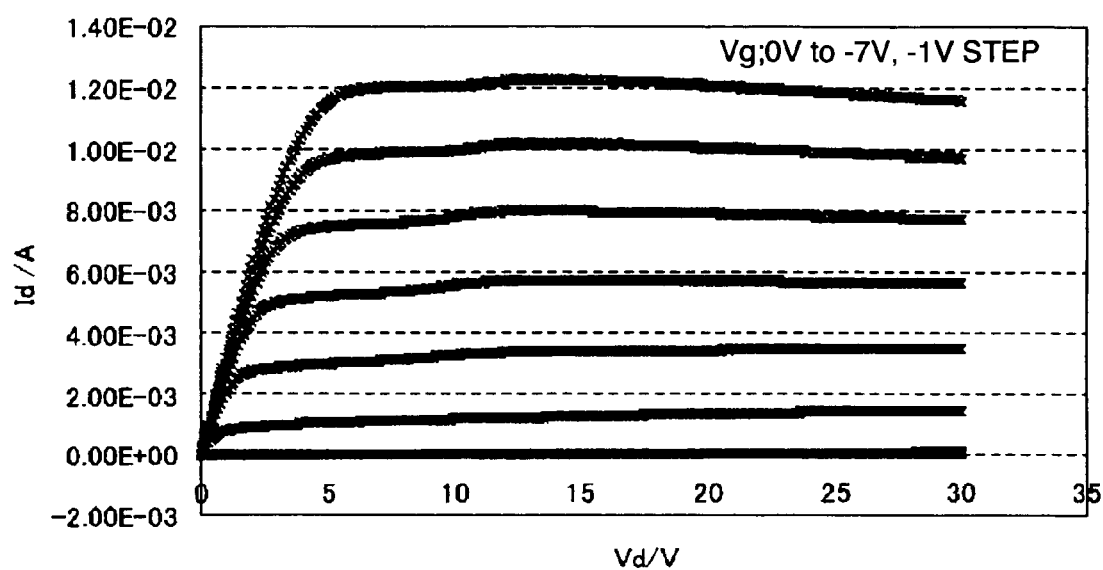
FIG. 5 is a graph showing a current/voltage characteristic at the time of applying a DC voltage to the GaN-HEMT obtained in Comparative Example 2.

Photolithography was performed such that a gate was located in alignment with an opened micropipe at the surface of the undoped-AlGaN layer within the obtained sample, and an FET was fabricated under the same conditions as in Example 1. Then, a current/voltage characteristic at the time of applying a DC voltage to this sample was measured, and the result is shown in FIG. 4. In addition, the same FET as described above was fabricated at a position in which micropipes do not exist within 2 mm of this position of the same sample as described above. Then a current/voltage characteristic at the time of applying a DC voltage to this sample was measured, and the result is shown in FIG. 5.

The invention claimed is:

1. An epitaxial crystal for a field effect transistor which has a nitride-based III-V group semiconductor epitaxial crystal grown on a SiC single crystal base substrate by use of an epitaxial growth method, wherein said SiC single crystal base substrate has micropipes therein, and at least a part of the micropipes spreading from the SiC single crystal base substrate into the epitaxial crystal terminate between an active layer of the transistor and the SiC single crystal base substrate.

2. The epitaxial crystal according to claim 1, wherein 90% or more of the micropipes within the SiC single crystal base substrate terminate between an active layer of the transistor and the SiC single crystal base substrate.

3. The epitaxial crystal according to claim 2, wherein the micropipes exist within the SiC single crystal base substrate at a density of 10 micropipes/cm$^2$ or more.

4. The epitaxial crystal according to any one of claims 1 to 3, wherein the epitaxial growth method is an organometallic vapor phase epitaxial method, and wherein a region between a buffer layer at least a part of which is composed of a polycrystal and an active layer composed of a single crystal has a nitride-based III-V group semiconductor epitaxial growth layer containing Ga, which has been grown to a thickness of at least 1 μm or more at a temperature of 1050° C. to 1250° C. and at a pressure of 5 torr to 780 torr.

5. A field effect transistor comprising the epitaxial crystal according to claim 1.

6. A method for manufacturing the epitaxial crystal according to any one of claims 1 to 3, comprising growing a nitride-based III-V group semiconductor epitaxial crystal on a SiC single crystal base substrate having micropipes by use of an epitaxial growth method, wherein at least one epitaxial crystal layer between the SiC single crystal base substrate and an active layer of the transistor is grown at a temperature of 1050° C. to 1250° C. and at a pressure of 5 torr to 780 torr.

7. The method according to claim 6, wherein the epitaxial growth method is an organometallic vapor phase epitaxial method, and wherein a nitride-based III-V group semiconductor epitaxial growth layer containing Ga and having a thickness of 1 μm or more is grown at a temperature of 1050° C. to 1250° C. and at a pressure of 5 torr to 780 torr between a buffer layer at least a part of which is composed of a polycrystal and an active layer composed of a single crystal.

8. The epitaxial crystal according to claim 1, wherein said micropipes penetrate through the substrate and have a diameter of several hundreds nanometers to several micrometers.

* * * * *